(12) United States Patent
Gill et al.

(10) Patent No.: US 6,308,406 B1
(45) Date of Patent: Oct. 30, 2001

(54) METHOD FOR FORMING AN ELECTRICAL CONDUCTIVE CIRCUIT ON A SUBSTRATE

(75) Inventors: Peter L. Gill, Hackettstown; Joseph W. Ramsey, East Hanover, both of NJ (US)

(73) Assignee: Thermotrax Corporation, East Hanover, NJ (US)

( * ) Notice: Subject to any disclaimer, the term of this patent is extended or adjusted under 35 U.S.C. 154(b) by 0 days.

(21) Appl. No.: 09/365,618

(22) Filed: Aug. 2, 1999

Related U.S. Application Data

(60) Provisional application No. 60/096,233, filed on Aug. 12, 1998.

(51) Int. Cl.[7] .................................................. H01K 3/00
(52) U.S. Cl. .............................. 29/849; 29/602.1; 29/846; 336/200
(58) Field of Search ............................. 29/846, 849, 848, 29/602.1, 749; 336/200

(56) References Cited

U.S. PATENT DOCUMENTS

| | | | |
|---|---|---|---|
| 3,445,921 | * 5/1969 | Leenhouts | 29/846 |
| 4,970,495 | * 11/1990 | Matsumoto et al. | 29/846 |
| 5,263,248 | * 11/1993 | Kiyota et al. | 29/846 |
| 5,950,305 | * 9/1999 | Roberts | 29/846 |
| 6,032,357 | * 3/2000 | Wojewnik | 29/846 |
| 6,087,940 | * 7/2000 | Caperna et al. | 29/846 |
| 6,161,276 | * 12/2000 | Droz | 29/849 |
| 6,176,010 | * 1/2001 | Droz | 29/846 |

* cited by examiner

*Primary Examiner*—Carl J. Arbes
(74) *Attorney, Agent, or Firm*—Patrick J. Pinto

(57) ABSTRACT

At least one conductive circuit 46 is formed on a substrate 12 that has a conductive layer 28 and a cover layer 40 bonded thereto. The conductive circuit 46 is formed by the severing of the conductive layer 28 into a conductive circuit 46 and a remaining portion 48 by a cutting edge of a cutting tool 50. The edge of the tool also causes the severed edges of the conductive path and the remaining portion to form a gap 52. An electrical insulating coating 54 covers the cover layer while filling the gaps 52. The insulator coating 54 is allowed to set for maintaining separation and integrity of the conductive path 46. The method of the present invention lends itself to manual, semi-automatic and/or automatic production of discrete articles.

18 Claims, 5 Drawing Sheets

METHOD FOR FORMING AN ELECTRICAL CONDUCTIVE CIRCUIT ON A SUBSTRATE

This application claims the benefit of U.S. Provisional Application Serial No. 60/096,233 that was filed on Aug. 12, 1998 and is co-pending herewith.

BACKGROUND OF THE INVENTION

The present invention was also described in a paper dated Dec. 1, 1997, that was submitted by the inventors and accepted into the Disclosure Document program as Disclosure Document No. 434368 on Apr. 7, 1998.

FIELD OF THE INVENTION

With regard to the classification of art, this invention is believed to be found in the general class entitled Electrical Conductors and Insulation and more particularly to those subclasses pertaining to methods for forming an electrical conductive pattern on a carrier material. The electrical conductive patterns are used in electrical circuit boards, low profile heater elements, and connecting means for electronic devices.

DESCRIPTION OF RELATED ART

The art of forming a conductive pattern on a substrate and the resulting products are well known. Traditionally the conductive pattern is formed on a copper clad substrate by employing a subtractive process, such as etching, machining and the like; or an additive process such as printing and the like. It has been found that there is a need to produce circuit patterns that are precise while minimizing the gaps between the circuit paths. The minimizing of the gaps between the circuit paths and the problems associated therewith have been identified in U.S. Pat. No. 5,493,074 that issued to Murata et al on Feb. 20, 1996. Murata teaches the use of a subtractive process such as etching for producing the conductive pattern then subsequently filling the gaps between the circuits with a cured product. However this process is slow, capital intensive, and involves the use of chemicals that may be hazardous to the environment. The known subtractive and/or additive processes mentioned above do not provide the electrical conductive pattern that has the precision and repeatability that is needed for certain applications. The lack of precision and repeatability results in variations of conductor values such as conductance, resistance and the like.

SUMMARY OF THE INVENTION

The present invention solves the above identified needs by precisely separating the conductive electrical paths by mechanical means. The instant invention does not require the use of hazardous chemicals. The present invention therefore provides a method that is economical by increasing productivity while minimizing the cost for the disposal of waste. The present invention lends itself to automatic production machinery.

The present invention may be briefly summarized with respect to its objects. It is an object of this invention to provide and it does provide a method for producing an electrical conductive pattern on a substrate that results in a precisely formed conductive circuit while simultaneously maintaining the separation of the conductive paths.

It is a further object of this invention to provide and it does provide a method for producing an electrical conductive pattern on a flexible substrate that is arrayed for attachment to a support means.

It is another object of this invention to provide and it does provide a method for producing an electrical conductive pattern on a substrate that results in an induction heater that has a low profile and provides a routing of a current through a conductive pathway that produces heat when a selected electrical current is applied. This method provides a precisely sized conductive pathway that is consistently reproducible.

It is still another object of this invention to provide and it does provide a method for producing a precise electrical conductive pattern on a flexible substrate that results in an induction heater that has a low profile and is arrayed for attachment to an article that is to be heated One embodiment of the method of the present invention may be briefly described as a method for producing an electrical conductive pattern on a substrate including the steps of:

a) providing a substrate layer, the substrate layer being non conductive and having a predetermined thickness;

b) bonding a layer of a conductive material to one face of the substrate layer by means of heat and pressure to activate a first bonding means, the first bonding means having a predetermined melting temperature, the one face of the substrate layer being cleaned and prepared by a treating means prior to the application of the bonding means;

c) bonding a cover layer to an exposed surface of the conductive material by means of heat and pressure to activate a second bonding means, the cover layer having a predetermined thickness and fully covering the exposed surface of the conductive material, the second bonding means having a predetermined melting temperature;

d) forming at least one path for an electrical circuit in the conductive material by severing the conductive material by and with a blade, the blade including a predetermined cutting edge configuration, the blade being further arrayed for providing a predetermined cutting pattern, the blade may also include a temperature control means for maintaining the blade within a predetermined temperature range; the cutting edge configuration of the blade being arrayed for severing the cover layer and penetrating a selected distance into the substrate layer during the severing of the conductive material, the blade simultaneously shaping and setting selected portions of the top layer, the second bonding means, the conductive material, and the first bonding means so that at least one continuous predetermined gap is provided between severed portions of the conductive layer;

e) subsequently applying an insulating coating completely over an exposed surface of the severed top layer so that the insulating coating also fills all of the predetermined gaps;

f) allowing the insulating coating to set so that the insulating coating maintains the predetermined gap as and when the flow of current passes through the at least one path;

g) applying, attaching, and connecting electrical connection terminals into selected positions along the at least one path;

h) selectively applying a pressure sensitive strip to an exposed surface of the insulating surface;

i) selectively applying a pressure sensitive strip to a second face of the substrate; and j) dividing the substrate and the circuits carried thereon into discreet units.

In addition to the above summary, the following disclosure is intended to be detailed to insure adequacy and aid in the understanding of the invention. However, this disclosure, showing particular embodiments of the invention, is not intended to describe each new inventive concept that may arise. These specific embodiments have been chosen to show at least one preferred or best mode of the present invention as presently known. These specific embodiments, as shown in the accompanying drawings, may also include diagrammatic symbols for the purpose of illustration and understanding.

Figure 1:
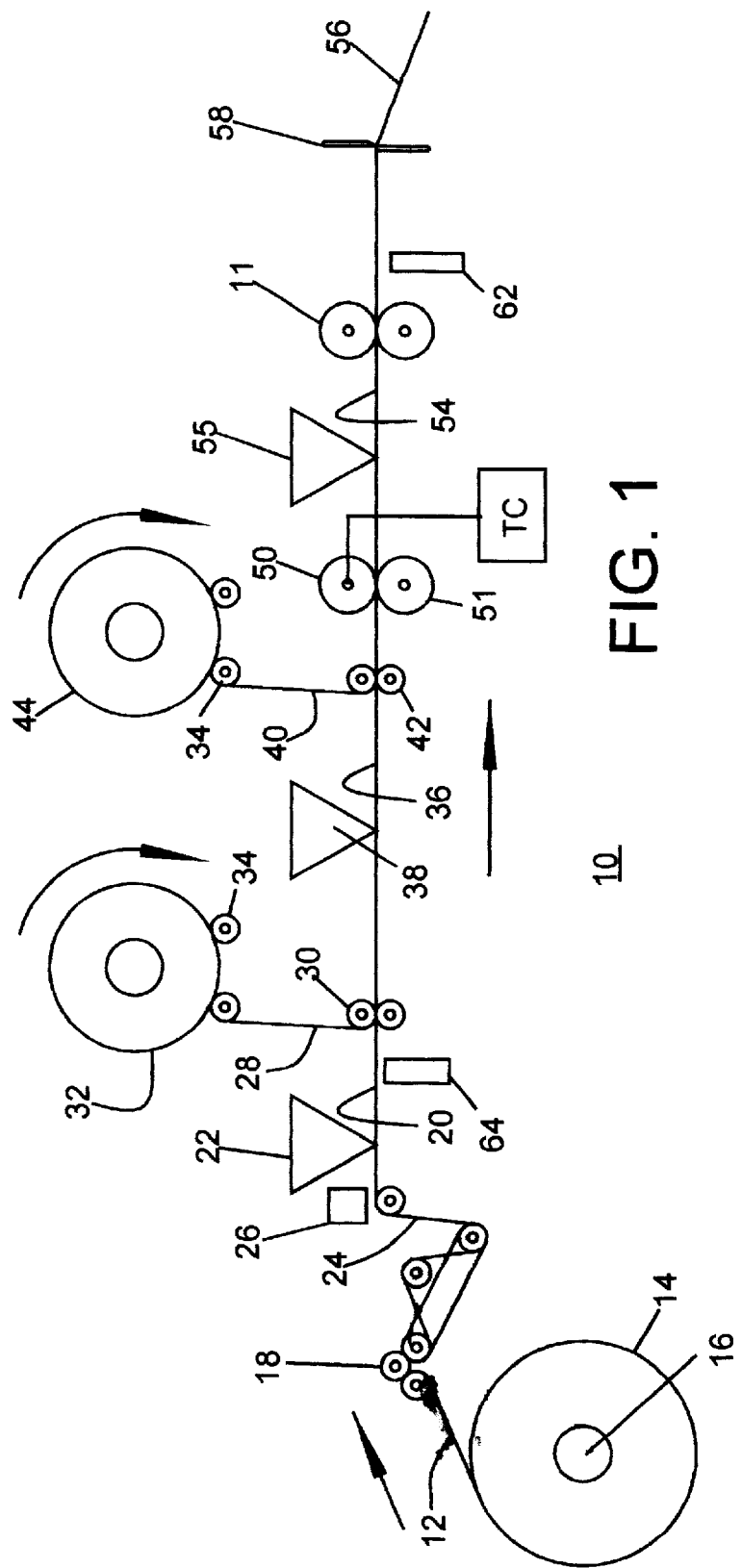
FIG. 1 represents a schematic of a first automated embodiment of the method of the present invention.

In the following description and in the appended claims, various details are identified by specific names for convenience. These names are intended to be generic in their application while differentiating between the various details. The corresponding reference numbers refer to like members throughout the several figures of the drawing.

The drawings accompanying and forming a part of this specification disclose specific details for the sole purpose of explanation. It is to be understood that the specific details may be modified without departing from the concept and principles of the invention as claimed. This invention may be incorporated into methods other than those that are specifically shown.

DETAILED DESCRIPTION OF THE INVENTION

Referring to the drawings which will be used to schematically describe a sequence or series of the steps that are included in the method of the present invention. This sequence of steps is preferably carried out on an in-line continuously moving conveyor type of apparatus that transports an elongated substrate and layers bonded thereto in the direction of the arrows by means of drive rollers 11. However the process also lends itself to an indexing type of apparatus that is capable of feeding either elongated webs or individual substrate pieces that have elongated layers bonded thereto.

Figure 5:
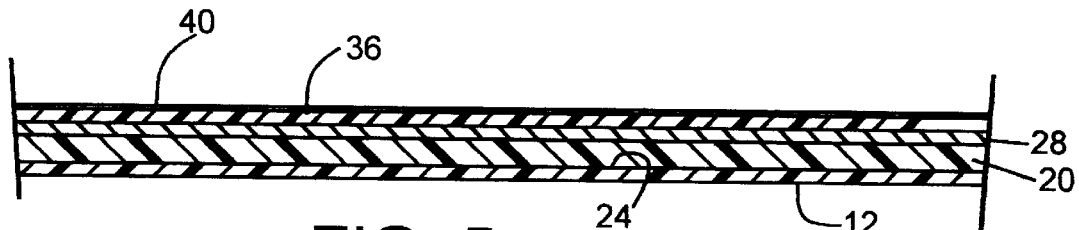
FIG. 5 represents a fragmentary cross sectional view of the article of FIG. 4 prior to the forming of the conductive paths therein.
Figure 6:
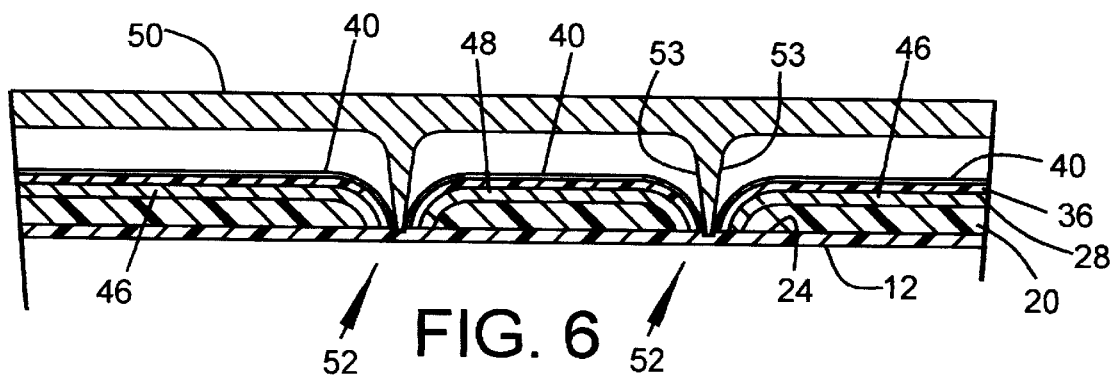
FIG. 6 represents a fragmentary cross sectional view of the article of FIG. 4 after the forming of the conductive paths therein.

Referring in particular to FIG. 1, FIG. 5; and FIG. 6, a first embodiment of the present invention is generally identified as a manufacturing process 10. This process 10 starts with a substrate or base material 12, shown as a coil of material 14, that is unwound, in the direction of the arrow, from an unwind stand or mandrel 16 by conventional means, such as a nip roll and dancer combination 18, but not limited thereto. The substrate 12 is preferably selected from non conductive materials such as linear polymers, cross-linked polymers, spun silica, mica, fiberglass, and the like. The type of substrate used is dependent on the end use for the article to be manufactured. More specific, but non-limiting, examples of material will be disclosed in connection with the several examples described below. A blanket coating of a bonding means 20 is applied to the substrate 12 by an applicator means 22. It is preferred that a top face 24 of the substrate 12 be treated by a surface treating means 26, such as a corona discharge but not limited thereto, for cleaning the top face 24, prior to the application of the bonding means 20.

A layer of a conductive or conductor material 28, such as aluminum, gold, copper and the like, but not limited thereto, is bonded to the substrate 12 and bonding means 20 laminate, by application of heat and pressure. The heat and pressure is applied thereto by a second pair of nip rollers 30. The heat and pressure should be sufficient to activate the bonding means 20 while providing a secure bond. Preferably, the conductive material 28 is fed from a supply coil 32. The supply coil 32 may be supported by and with conventional means such as a cradle arrangement 34, as shown in FIG. 1, or alternatively by other suitable means, such as a mandrel. The thickness of the conductor material 28 is dependent on the desired electrical characteristics of the type of conductor material 28 and may be selected from within the range of 0.08 mm (0.0003 in) and 1.6 mm (0.0625 in.).

A second bonding means 36 is applied to an exposed surface of the conductor 28 and the substrate 12 bonded assembly at an applicator station 38. Subsequently a non conductive cover layer 40 is bonded to the conductive material 28 by the application of heat and pressure by a third pair of nip rollers 42. Of course, the heat and pressure should be sufficient to activate the second bonding means 36 while providing a secure bond. The non conductive cover layer 40 is preferably fed from a supply roll 44. The supply roll 44 may be supported by and with a conventional means such as either a cradle arrangement 34, as shown, or by a mandrel similar to 16.

At least one continuous conductive pattern or path 46 and at least one remaining portion 48 is formed in the conductive material 28 by a combination of a rotary cutting tool or blade 50 and anvil 51. An example of the conductive path 46 may be more clearly seen in FIG. 4 and FIG. 6. The cutting tool or blade 50 should be contoured, sharpened, and adjusted to sever the cover layer 40, the conductive material 28, and penetrate a selected distance, in the neighborhood of 0.025 mm (0.001 in.), into the substrate or base layer 12. During the severing action by the tool 50, the severed edges of the conductive path 46 and the severed edges of the remaining portion are displaced downward to form a shaped gap 52 therebetween. The blade 50 sets the shape of the gap 52 for filling during the subsequent steps in the process. It has been found that a blade 50 should have a maximum draft angle of its side wall 53 of less than 7.5 degrees with respect to vertical to provide the desired results.

It is preferred that the cutting tool 50 be arrayed to include a temperature control means TC, seen in FIG. 1, for maintaining its temperature within a predetermined range. The temperature control means TC would heat or cool the tool 50, as needed, to maintain a selected temperature range. It is preferred that the selected temperature range allow the setting of the shape of the gap 52 while simultaneously stabilizing the cutting tool dimensions. The stabilization of the cutting tool dimensions provides predictable and repeatable conductive patterns or paths 46.

The cover layer 40 should be of a sufficient thickness to ensure a clean severing of the conductive material by the blade 50 while subsequently holding the desired shape of the gap 52. It has been found that a thickness between the range of 0.0088 mm (0.00035 in.) and 0.13 mm (0.005 in) is sufficient for the process as presently practiced. More specific examples will be discussed in connection with the several examples described below.

Figure 7:
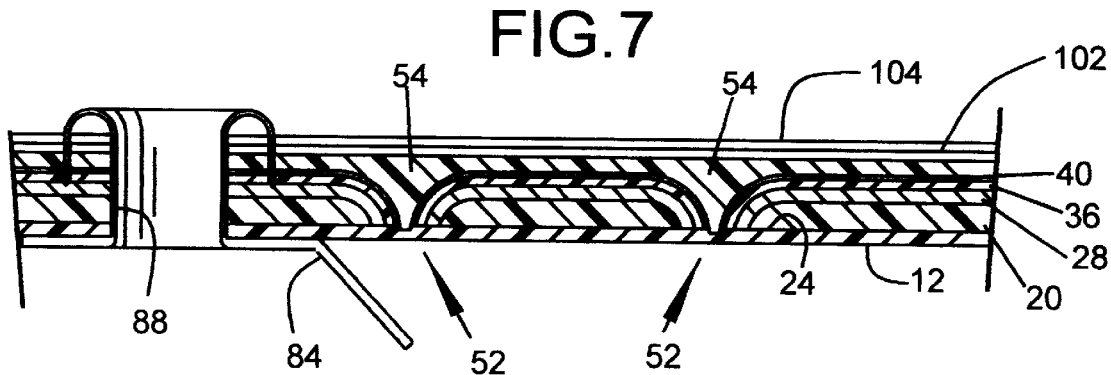
FIG. 7 represents a fragmentary cross sectional view of the article of FIG. 4. This view showing one of the embodiments of a finished article.

Referring now to FIG. 1 and FIG. 7, an electrical insulating coating 54 is applied to the cover layer 40 by a coating assembly 55 so that the coating 54 flows into the gaps 50 and completely fills them while simultaneously covering the cover layer 40. The insulating coating 54, such as varnish, cross-linked polymer and the like needs to be subsequently set by being dried or cured, so that the gap 50 is maintained between the conductive path 46 and the remaining portion 48. The insulating layer 54 may be formulated for including adhesive properties for attaching to a supporting article.

Referring again to FIG. 1 and FIG. 4, subsequent to the application of the insulating coating 54, the substrate 12 carrying the conductive pattern thereon may be severed into discrete portions 56 by a cutting means 58. The cutting means 58 may be carried on a reciprocating carriage, not shown, that travels with substrate 12. The timing and positioning of the cut with respect to the pattern of the conductive path is preferably controlled by an eye or registration mark 60 that was previously imprinted on the substrate and detected by a sensing means 62, such as photocell. One non limiting example of the imprinting an eye mark 60 may occur prior to the placement of the conductive material 28 by a printing means 64. Alternatively, the eye mark 60 may be imprinted on a selected surface the conductive material 28. The printing of the eye mark 60 by the printing head 64 may be in response to a signal or pulse from the machine control system. The discrete portions 56 may be delivered to other stations for testing and/or for the application of electrical connectors. The embodiment 10 described above may be used when the article or discrete portions 56 have a rectilinear peripheral outline 66, as shown in dashed outline in FIG. 4.

Referring now to FIGS. 2, 3, 5, 6, and 7; a first stage 68 of a second embodiment for the execution of the method of the present invention is generally identified as 70. In this second embodiment 70, the sequence of steps is similar to the first embodiment 10. This process 10 also starts with a substrate or base material 12, shown as a coil of material 14, that is unwound, in the direction of the arrow A, from an unwind stand or mandrel 16 by a non-limiting conventional means, such as a nip roll and dancer combination 18. A blanket coating of a bonding means 20 is applied by an applicator means 22 to the substrate 12 that has been previously treated, as describe in connection with embodiment 10. It is to noted that the bonding means 20 may have been previously applied to the substrate 12 at a step prior to being wound as coil 14.

A layer of a conductive or conductor material 28, such as aluminum, gold, copper and the like, but not limited thereto, is bonded to the substrate 12 and bonding means 20 laminate, by application of suitable amount heat and pressure by nip rolls 30 to effect a good bond. As mentioned above, the flexible conductive material or foil 28 is fed from a supply coil 32.

A second bonding means 36 is applied to an exposed surface of the conductor 28 and the substrate 12 bonded assembly at an applicator station 38. Subsequently a non conductive cover layer 40 is bonded to the conductive material by the application of the appropriate amount of heat and pressure by a third pair of nip rollers 42. The non conductive cover layer 40 is preferably fed from a supply roll 44.

At least one continuous conductive pattern or path 46 and at least one remaining portion 48 is formed in the conductive material 28 by a rotary cutting tool or blade 50 and anvil 51. One non limiting example of a conductive path 46 and its cross section shape may be more clearly seen in FIG. 4 and FIG. 6. The action of the rotary cutting tool 50 was described above in connection with embodiment 10.

It is preferred that an eye mark and article identifying means 60 be placed on the substrate 12 by a printing means 64 for subsequent use. The positioning of the eye mark and its control have been discussed above.

Figure 2:
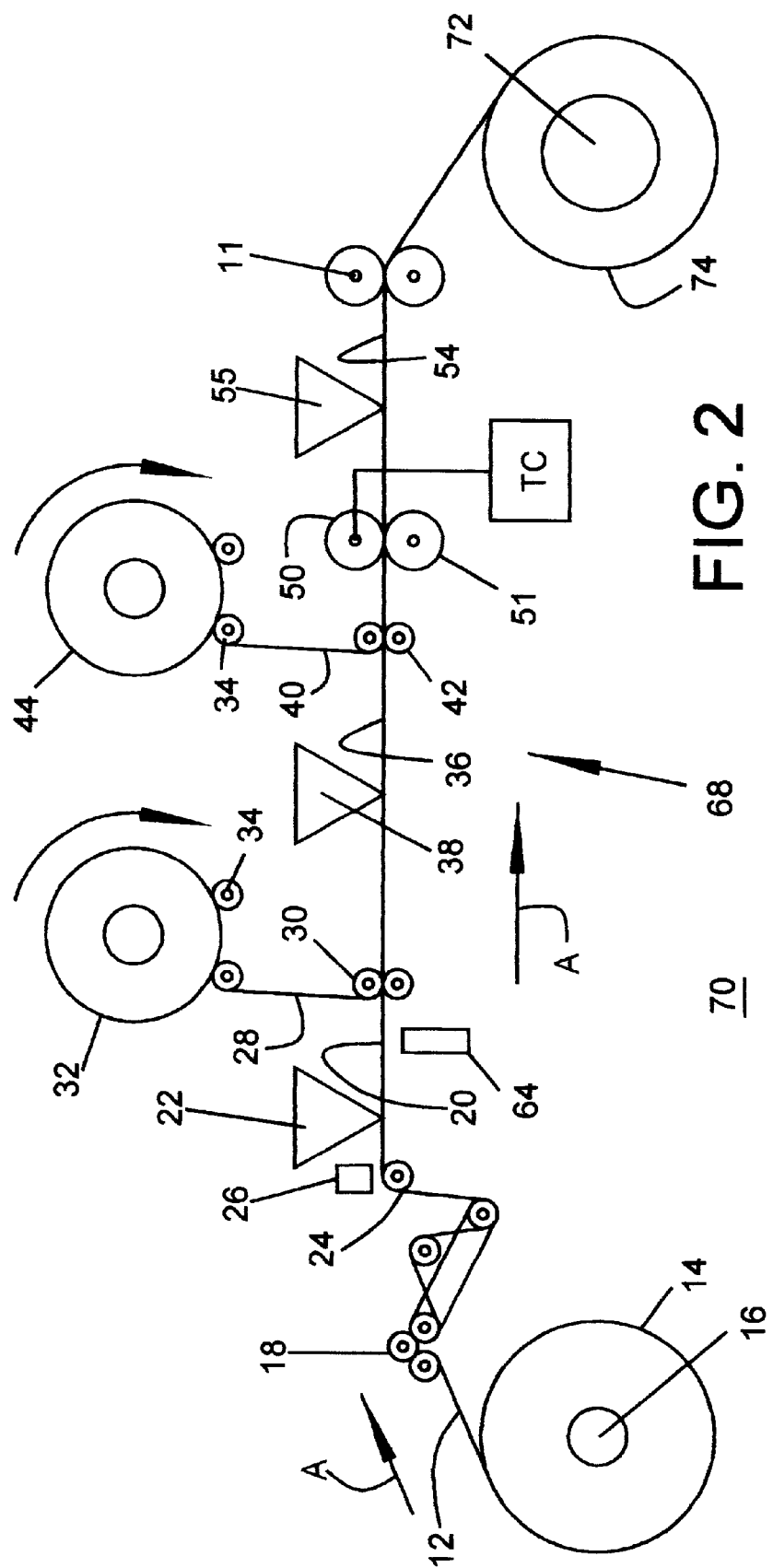
FIG. 2 represents a schematic of a second automated embodiment of the method of the present invention. This view showing a first portion of the second automated embodiment.

Referring in particular to FIG. 2 and FIG. 7, an electrical insulating coating 54 is applied to the cover layer 40 by a coating assembly 55 so that the coating 54 flows into the gaps 52 and completely fills them while simultaneously covering the cover layer 40. The insulating coating 54, that has been also described above, needs to be subsequently set by being dried or cured, so that the gap 52 is maintained between the conductive path 46 and the remaining portion 48.

The distinguishing difference between embodiments 10 and 70 is that the elongated laminated article containing the conductive pattern 46 thereon is fed by drive rollers 11 onto a conventional winding means 72 to be formed into a coil 74 for finishing of the process at a separate stage 80 of the process 70.

Figure 3:
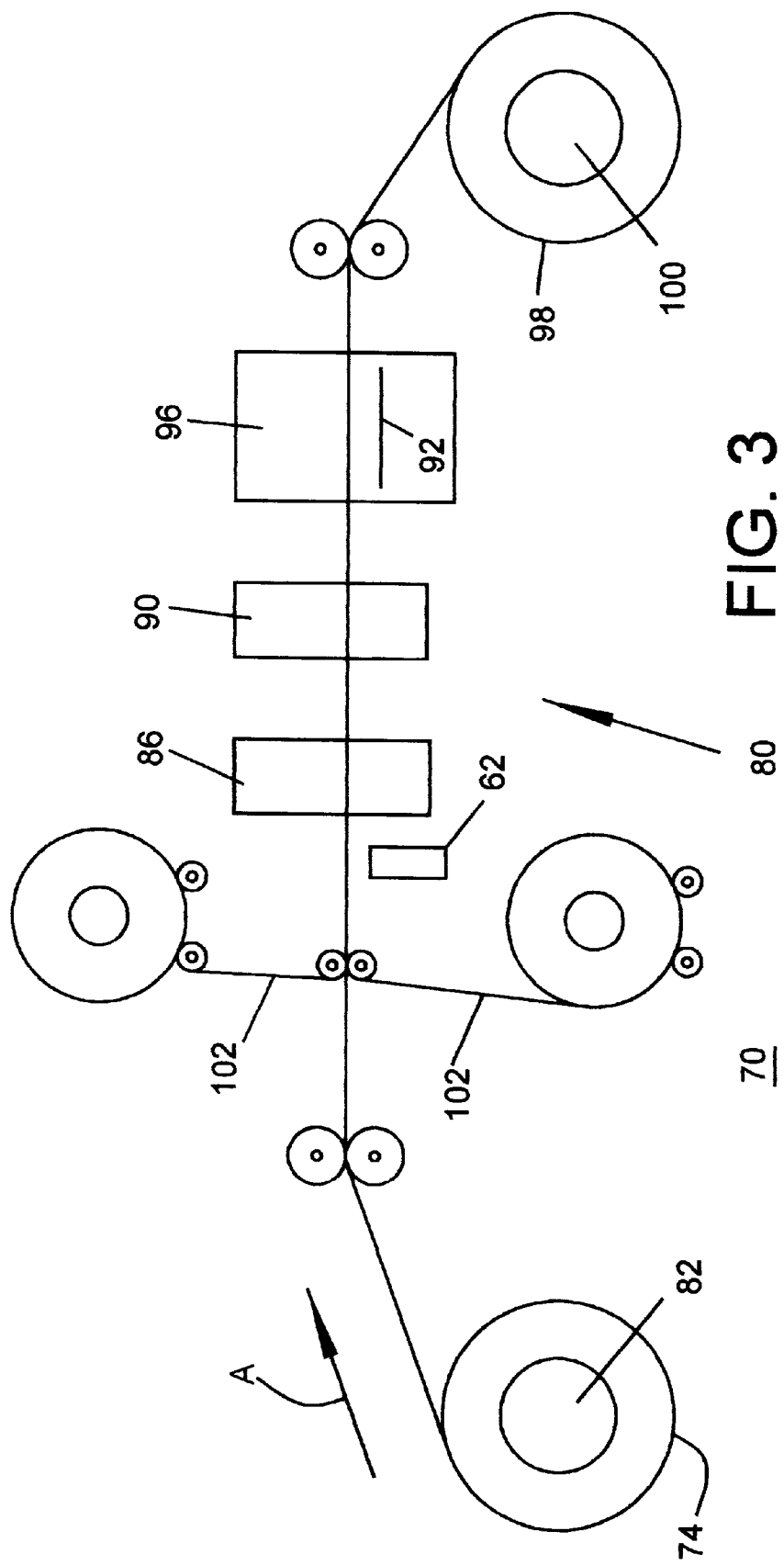
FIG. 3 represents a finishing portion of the second automated embodiment of the method of the present invention.
Figure 4:
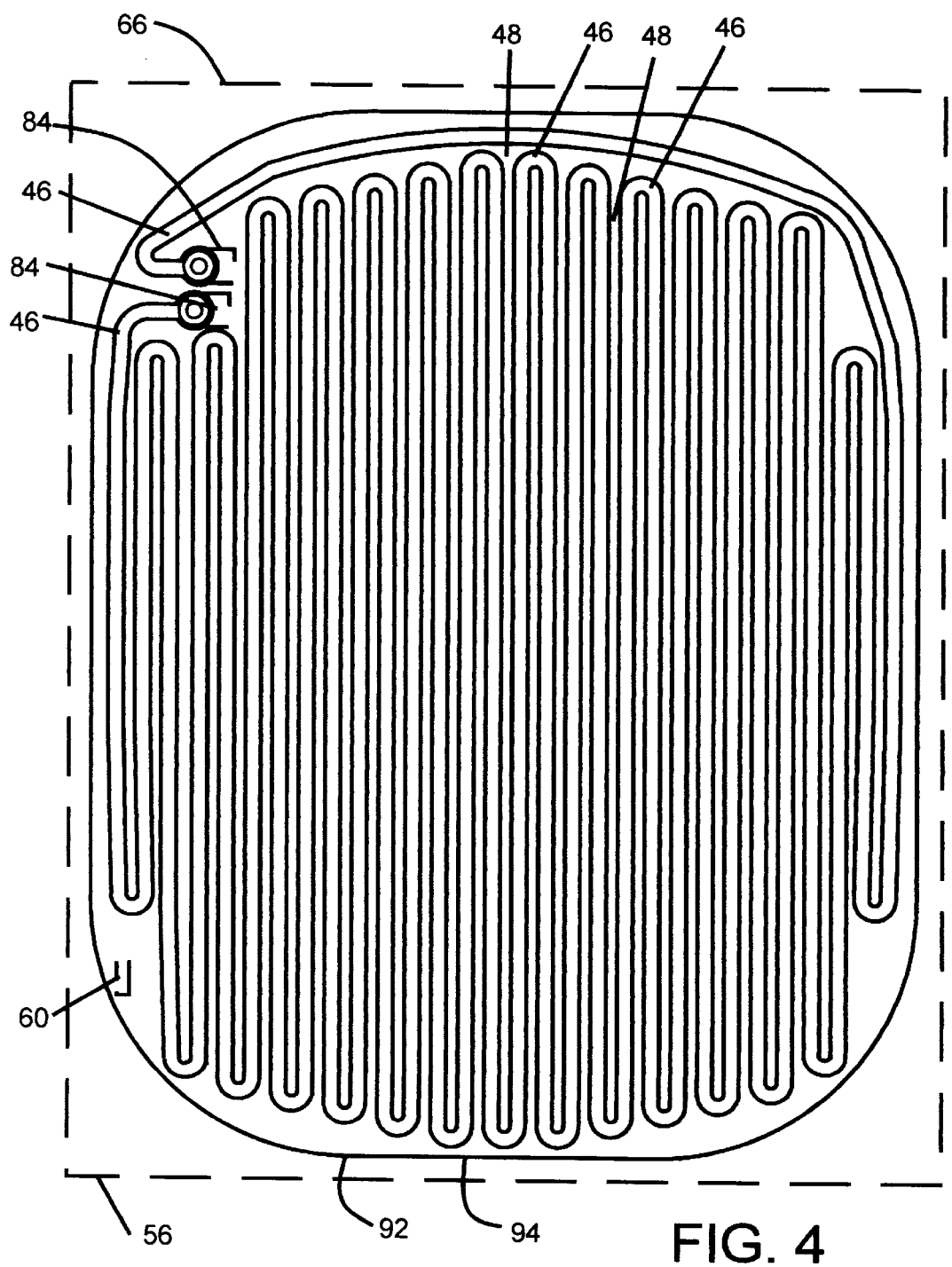
FIG. 4 represents a plan view of a typical article that may be produced by the method of the present invention.

Referring now to FIGS. 3, 4 and 7, the second or finishing stage 80 of the process 70 begins with the coil 74 of the elongated laminated web being supported on a mandrel 82 of a machine unwind stand. The insulating coating 54 surface of the laminate has been wound on the outside of the coil 74 at the end the first stage 68 of the process 70, that was previously described in connection with FIG. 2. The web of the elongated flexible laminate is fed in the direction of the arrow A.

Electrical terminals 84 are automatically applied to the elongated laminate by a terminal application means 86. This terminal application means 86 includes the operation of punching an aperture 88, more clearly seen in FIG. 7, in the laminate then automatically depositing a terminal 84 into the aperture 88, subsequently the terminal 84 is fastened to the elongated laminate by a riveting process. The positioning and placement of the electrical terminal 84 or alternatively another selected electrical component is controlled by a sensing means 62, such as a photocell, that senses the relative position of the eye mark 60 that was previously applied in the first stage 68.

It is preferred that, the attachment of the terminals 84 to the conductive path or paths 46 be tested at a testing station 90. The testing station may include means for identifying any particular circuits that do not meet testing standards by printing appropriate indicia thereon.

A finished product 92 that has a shaped periphery 94, seen more clearly in FIG. 4 is separated from the elongated web of laminated material by a reciprocating cutting tool assembly 96. The tool 96 is arrayed for clamping the laminate and travels therewith during the cutting operation. A sequencing means may separate the accepted articles 92 from the rejected articles 92 by a transverse shuttle means, not shown. Alternatively, the cutting tool assembly 96 may be operated by a sequencing program to only separate good circuits from the elongated web. The remaining elongated web of material may be wound onto a coil 98 by a rewind assembly 100 for recycling purposes.

In some applications, such as in the production of a low profile induction heater, it may be desirable to apply a pressure sensitive adhesive strip 102 to a selected side of the elongated web of the laminated product prior to the application of the electrical terminals 84. The pressure sensitive adhesive strip 102 preferably has a protective covering 104 that is removed when the discrete articles 92 are applied to a surface of an article to be heated. Another benefit found when using the article 92 as an induction heater is in its use as a heater for a glass surface, such as a glass defogger, aquarium heater and the like. The remaining portion 48 aids in the uniform distribution of the heat through a rigid insulating material, such as glass. The periphery 94 of the article 92 may be contoured to closely match any surface to which it may be attached.

In the previous discussion, the second embodiment 70 has been depicted as being broken into two separate stages 68 and 80. It is to be noted that method of the second embodiment 70 may be carried out in one continuous series of steps on a single production apparatus.

FIRST EXAMPLE

A first non-limiting example of materials that may be used in the production of the discrete articles or portions 56 or 92 that are to be used in a low temperature application includes: a substrate 12 made from a polypropylene material that has a thickness between 0.08 mm (0.003 in) and 0.8 mm (0.030 in.); a conductive material 28 of copper; a cover layer 40 of 0.04 mm (0.0015 in) thick polyester. The laminate is bonded together by a first bonding means 20 and second bonding means 36 such as a hot melt adhesive having a melt temperature of 110 degrees C. (230 F.). The insulating coating 54 is a solvent based varnish.

SECOND EXAMPLE

A second non-limiting example of materials that may be used in the production of the discrete articles or portions 56 or 92 that are to be used as a low profile induction heater having a maximum temperature range of 148.9 degrees C. (300 F.) includes: a substrate 12 made from a polyester material that has a thickness between 0.08 mm (0.003 in) and 0.8 mm (0.030 in.); a conductive material 28, such as aluminum and having a thickness between 0.08 mm. and 0.126 mm.; a cover layer 40 of 0.04 mm (0.0015 in) thick polyester. The laminate is bonded together by a first bonding means 20 and second bonding means 36 such as a hot melt adhesive having a melt temperature of 182.2 degrees C. (360 F.). The insulating coating 54 is preferably a cross linked polymer. Alternatively the insulating coating 54 may include adhesive properties for adhering to an article to be heated. The predetermined electrical and or heating characteristics and the width of the path 46 of the conductive material 28 will determine the thickness needed.

THIRD EXAMPLE

A second non-limiting example of materials that may be used in the production of the discrete articles or portions 56 or 92 that are to be used in a low profile induction heater having a maximum temperature range of 171 degrees C. (340 F.) includes: a substrate 12 made from a polyimide material that has a thickness between 0.08 mm (0.003 in) and 0.8 mm (0.030 in.); a conductive material 28 of aluminum having a thickness between 0.08 mm. and 0.126 mm.; a cover layer 40 of 0.04 mm (0.0015 in) thick polyester. The laminate is bonded together by a first bonding means 20 and second bonding means 36 such as a resin based adhesive having a melt temperature of 232.2 degrees C. (450 F.). The insulating coating 54 is a high temp varnish.

As it was previously mentioned, that the method of the present invention may be carried out by using the embodiments disclosed as the first embodiment 10 and the second embodiment 70. The second embodiment 70 may be carried out either in a single or multiple stages. This method also lends itself to the production of electrical circuits on individual pieces of a substrate material. The steps of the process may be performed manually, semi-automatically, or on an indexing type of apparatus. It is to be noted that the cutting tool 50 has been preferably shown as being of a rotary type, however a planar cutting tool may also be used in its place. The planar cutting tool may be employed in a manual or semi-automatic operation.

The discrete articles 92 made using a flexible substrate 12 may be bonded to a support board by means of a pressure sensitive adhesive or strip.

The method of the present invention may also be employed for producing back to back circuit patterns on the flexible substrate 12. One non-limiting example for producing circuit patterns on each side of the flexible substrate employs a continuous process similar to that shown in FIG. 1 wherein subsequent to the step of applying the insulating coating 54 by the coating assembly 55, the laminate passes through a conventional turnover bar so that the top face 24 of the substrate is now facing downward. The process or the steps described in conjunction with FIG. 1 is repeated prior to the selective application of terminals, finishing and/or cutting of the laminate into discrete articles. It is to be noted that a two stage process similar to process 70 may be employed. A selectively different type and/or thickness of conductive material 28 may be applied to each side of the substrate for the back to back circuits.

The present invention provides a method of reproducing circuit patterns that are dimensionally uniform, and may be produced automatically at economical rates. The method of the first embodiment 10 produces little or no waste. The method of the alternate embodiment 70 produces minimal waste.

It is to be noted that the second nip rollers 30 and the third nip rollers 42 may need to have a temperature control system and means similar to temperature control means TC, similar to that depicted in FIG. 1 in connection with tool 50. It is preferred that nip rollers 30 and 42 includes an adjustable pressure means.

Directional terms such as "front", "back", "in", "out", "downward", "upper", "lower", "vertical" and the like may have been used in the description. These terms are applicable to the embodiments shown and described in conjunction with the drawings. These terms are merely used for the purpose of description in connection with the drawings and do not necessarily apply to the position in which the present invention may be used.

While these particular embodiments of the present invention have been shown and described, it is to be understood that the invention is not limited thereto and protection is sought to the broadest extent that the prior art allows.

What is claimed is:

1. A method for producing an electrical conductive pattern and circuit on a substrate including the steps of:

a) providing an elongated web of a substrate layer, said substrate layer being non conductive and having a predetermined thickness; said elongated web of the substrate layer having an eye mark placed thereon;

b) bonding a layer of a conductive material to one face of the substrate layer by means of a first bonding means, said first bonding means having a predetermined melting temperature;

c) bonding a cover layer to an exposed surface of the conductive material by means of a second bonding means, said cover layer having a predetermined thickness and fully covering said exposed surface of the conductive material, said second bonding means having a predetermined melting temperature;

d) forming at least one path for an electrical conductive pattern and circuit in said conductive material by severing the conductive material by means of a blade, said blade including a predetermined cutting edge configuration, said blade also including a predetermined cutting pattern arrayed thereon, said blade also severing the cover layer and penetrating a selected distance into the substrate layer during said severing of the conductive material, said blade simultaneously shaping and setting selected portions of the top layer, the second bonding means, the conductive material, and the first bonding means so that at least one predetermined gap is formed between severed portions of the layer of the conductive material;

e) subsequently applying an insulating coating completely over an exposed surface of the severed cover layer so at the insulating coating also fills all of the predetermined gaps, and f) allowing the insulating coating to set, said setting of the insulating coating maintains said predetermined gap during the flow of current through said at least one path.

2. A method as recited in claim 1 which includes the further step of treating the one face of the substrate layer with a surface treating means.

3. A method as recited in claim 1 which includes the further step of providing a temperature control means that maintains said blade within the predetermined temperature range.

4. A method as recited in claim 1 which further includes the step of attaching and connecting electrical terminals at and to selected points along each of the at least one paths.

5. A method as recited in claim 4 which includes the further step of; using the eye mark on the elongated web of the substrate layer for positioning the electrical terminals at the selected points.

6. A method as recited in claim 1 which further includes step of cutting said substrate layer having said electrical conductive pattern and circuit formed thereon into discrete articles having a predetermined periphery by a cutting means.

7. A method as recited in claim 6 which includes the further step of placing the eye mark on the elongated web of the substrate layer by means of a printing head, said eye mark being used for registering and positioning said substrate layer having said electrical conductive pattern and circuit formed thereon with respect to said cutting means.

8. A method as recited in claim 1 which includes the further step of attaching at least one pressure sensitive adhesive strip to said substrate layer having said electrical conductive pattern and circuit formed thereon subsequent to the step of allowing said insulating coating to set.

9. A method as recited in claim 1 wherein the step of bonding the layer of the conductive material to the one face of the substrate layer includes the step of applying a predetermined heat and pressure by a second pair of rollers.

10. A method as recited in claim 1 wherein the step of bonding the cover layer to an exposed surface of the conductive material by means of a second bonding means includes the step of applying a predetermined heat and pressure by a third pair of rollers.

11. A method for producing an electrical conductive pattern on a substrate including the steps of:

a) providing an elongated web of a substrate layer, the substrate layer being non conductive and having a predetermined thickness;

b) bonding a layer of an elongated web of a conductive material to one face of the substrate layer by means of heat and pressure to activate a first bonding means, the first bonding means having a predetermined melting temperature, the one face of the substrate layer being cleaned and prepared by a treating means prior to the application of the bonding means;

c) bonding an elongated web of a cover layer to an exposed surface of the conductive material by means of heat and pressure to activate a second bonding means, the cover layer having a predetermined thickness and fully covering the exposed surface of the conductive material, the second bonding means having a predetermined melting temperature;

d) forming at least one path for an electrical circuit in the conductive material by severing the conductive material by and with a blade, the blade including a predetermined cutting edge configuration, the blade being further arrayed for providing a predetermined cutting pattern, the blade being further arrayed for including a temperature control means for maintaining the blade within a predetermined temperature range; the cutting edge configuration of the blade being arrayed for severing the cover layer and penetrating a selected distance into the substrate layer during the severing of the conductive material, the blade simultaneously shaping and setting selected portions of the top layer, the second bonding means, the conductive material, and the first bonding means so that at least one continuous predetermined gap is provided between severed portions of the layer of the conductive material;

e) subsequently applying an insulating coating completely over an exposed surface of the severed top layer so that the insulating coating also fills all of the predetermined gaps;

f) allowing the insulating coating to set so that the insulating coating maintains the predetermined gap as and when the flow of current passes through the at least one path;

g) applying electrical connection terminals into selected positions along the at least one path; and h) dividing the substrate layer and the circuits carried thereon into discreet units.

12. A method as recited in claim 11 which includes the further step of placing an eye mark on the substrate layer at a selected position.

13. A method for producing a low profile electrical heating element including the steps of:

a) providing an elongated web of a substrate layer, the substrate layer being non conductive and having a predetermined thickness;

b) bonding a layer of a conductive material to one face of the substrate layer, said conductive layer having a predetermined thickness and conductivity, the first bonding means having a predetermined melting temperature, the one face of the substrate layer being cleaned and prepared by a treating means prior to the application of the bonding means;

c) bonding a cover layer to an exposed surface of the conductive material, the cover layer having a predetermined thickness and fully covering the exposed surface of the conductive material, the second bonding means having a predetermined melting temperature;

d) providing an eye mark at a selected position along said elongated web and forming at least one path for an electrical heating circuit in the conductive material by severing the conductive material by and with a blade, the blade including a predetermined cutting edge configuration, the blade being further arrayed for providing a predetermined cutting pattern, the blade being further arrayed to include a temperature control means for maintaining the blade within a predetermined temperature range; the cutting edge configuration of the blade being arrayed for severing the cover layer and penetrating a selected distance into the substrate layer during the severing of the conductive material, the blade simultaneously shaping and setting select portions of the top layer, the second bonding means, the conductive material, and the first bonding means so that at least one continuous predetermined gap is provided between severed portions of the layer of the conductive material;

e) subsequently applying an insulating coating completely over an exposed surface of the severed top layer so that the insulating coating also fills all of the predetermined gaps;

f) allowing the insulating coating to set so that the insulating coating maintains the predetermined gap as and when the flow of current passes through the at least one path;

g) Applying electrical connection terminals into selected positions along the at least one path.

14. A method as recited in claim 13 wherein the conductive material is an aluminum material having a predetermined thickness between 0.08 mm and 1.6 mm.

15. A method as recited in claim 13 wherein the predetermined thickness of cover layer is between 0.0088 mm and 0.13 mm.

16. A method as recited in claim 13 which includes the further step of separating the substrate layer and the circuits carried thereon into discreet units by a cutting means.

17. A method as recited in claim 13 wherein the step of bonding the layer of the conductive material to the one face of the substrate layer includes the step of applying a predetermined heat and pressure by a second pair of rollers; and the step of bonding the cover layer to the exposed surface of the conductive material includes the step of applying a predetermined heat and pressure by a third pair of rollers.

18. A method as recited in claim 13 which includes the further step of using the eye mark for registering said at least one path for an electrical heating circuit with a cutting means for separating the substrate layer and the electrical heating circuits carried thereon into discreet units.

* * * * *